United States Patent
Kim et al.

(10) Patent No.: US 9,570,674 B2
(45) Date of Patent: Feb. 14, 2017

(54) MAGNETIC DEVICE

(71) Applicant: Samsung Electronics Co., Ltd., Suwon-si, Gyeonggi-do (KR)

(72) Inventors: Kee-won Kim, Suwon-si (KR); Sang-hwan Park, Hwaseong-si (KR); Sang-yong Kim, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 105 days.

(21) Appl. No.: 14/693,852

(22) Filed: Apr. 22, 2015

(65) Prior Publication Data

US 2015/0340600 A1 Nov. 26, 2015

(30) Foreign Application Priority Data

May 23, 2014 (KR) .................. 10-2014-0062587

(51) Int. Cl.
| | | |
|---|---|---|
| *H01L 43/10* | (2006.01) | |
| *H01L 43/02* | (2006.01) | |
| *H01L 27/22* | (2006.01) | |
| *H01L 43/08* | (2006.01) | |

(52) U.S. Cl.
CPC ............ *H01L 43/10* (2013.01); *H01L 27/228* (2013.01); *H01L 43/02* (2013.01); *H01L 43/08* (2013.01)

(58) Field of Classification Search
CPC ........ H01L 43/10; H01L 27/228; H01L 43/02; H01L 43/08
See application file for complete search history.

(56) References Cited

U.S. PATENT DOCUMENTS

| | | |
|---|---|---|
| 5,465,185 A | 11/1995 | Heim et al. |
| 7,924,607 B2 | 4/2011 | Yoshikawa et al. |
| 8,299,552 B2 | 10/2012 | Nagase et al. |
| 2008/0225583 A1* | 9/2008 | Guo ................. G11C 11/16 365/173 |
| 2009/0046397 A1 | 2/2009 | Sun et al. |
| 2010/0183902 A1 | 7/2010 | Kim et al. |
| 2012/0063214 A1* | 3/2012 | Min ................ G11C 11/1675 365/158 |
| 2012/0288963 A1 | 11/2012 | Nishimura |
| 2012/0292724 A1 | 11/2012 | Lim et al. |
| 2013/0075839 A1 | 3/2013 | Chen et al. |
| 2013/0075845 A1 | 3/2013 | Chen et al. |

(Continued)

OTHER PUBLICATIONS

Parkin, "Systematic Variation of the Strength and Oscillation Period of Indirect Magnetic Exchange Coupling through the 3d, 4d, and 5d Transition Metals," The American Physical Society, Physical Review Letters, vol. 67, No. 25, Dec. 16, 1991, pp. 3598-3601.

*Primary Examiner* — Errol Fernandes
(74) *Attorney, Agent, or Firm* — Renaissance IP Law Group LLP

(57) ABSTRACT

A magnetic device includes a free layer including a first magnetization layer; a pinned layer including a second magnetization layer; and a tunnel barrier layer provided between the free layer and the pinned layer. At least one selected from the free layer and the pinned layer includes a synthetic antiferromagnetic (SAF) structure formed of a first ferromagnetic layer, a second ferromagnetic layer, and a ruthenium-rhodium (Ru—Rh) alloy layer provided between the first and second ferromagnetic layers.

15 Claims, 15 Drawing Sheets

(56) References Cited

U.S. PATENT DOCUMENTS

2013/0148419 A1 6/2013 Prejbeanu et al.
2013/0161770 A1 6/2013 Meng et al.
2013/0224521 A1 8/2013 Wang et al.
2013/0250669 A1 9/2013 Shukh

* cited by examiner

MAGNETIC DEVICE

CROSS-REFERENCE TO RELATED APPLICATION

This application claims the benefit of Korean Patent Application No. 10-2014-0062587, filed on May 23, 2014, in the Korean Intellectual Property Office, the disclosure of which is incorporated herein in its entirety by reference.

BACKGROUND

The inventive concept relates to a magnetic device, and more particularly, to a magnetic device including a magnetic layer having a synthetic antiferromagnetic (SAF) structure and a magnetic memory device using the magnetic device.

Recently, magnetic devices having a magnetic tunnel junction (MTJ) with a tunnel magnetoresistance (TMR) property has attracted a great deal of attention due to its characteristics, including low-power consumption, fast read-write access time and non-volatility. In order to improve the performance of the magnetic devices, to stabilize magnetic structures, and to prevent read/write errors, SAF structures having exchange coupling have been suggested. In general, as the strength of an exchange coupling field increases, the magnetic devices may become more stable.

When a magnetic device is annealed to increase a magnetoresistance ratio, due to an increase in the temperature, materials of the magnetic device may spread to the surrounding areas, thereby deteriorating the performance of the magnetic device. Therefore, it is necessary to develop a magnetic device structure having more tolerance to the temperature increase.

SUMMARY

The inventive concept provides a magnetic device that includes an exchange coupling field to improve properties of the magnetic device and has excellent thermal tolerance so that stable operation is possible at a high temperature.

According to an aspect of the inventive concept, there is provided a magnetic device including a free layer including a first magnetization layer; a pinned layer including a second magnetization layer; and a tunnel barrier layer provided between the free layer and the pinned layer. At least one selected from the first magnetization layer and the second magnetization layer includes a synthetic antiferromagnetic (SAF) structure formed of a first ferromagnetic layer, a second ferromagnetic layer, and a ruthenium-rhodium (Ru—Rh) alloy layer provided between the first and second ferromagnetic layers.

The Ru—Rh alloy layer may include at least about 1 at % to not more than about 60 at % of Rh, and a remainder of the Ru—Rh alloy layer includes a Ru alloy.

The Ru—Rh alloy layer may have a hexagonal close packed (HCP) crystalline structure.

The Ru—Rh alloy layer may include at least about 1 at % to not more than about 15 at % of at least one element selected from iridium (Ir), rhenium (Re), osmium (Os), molybdenum (Mo), tungsten (W), tantalum (Ta), chrome (Cr), and copper (Cu).

A thickness of the Ru—Rh alloy layer may range from about 3 to about 15.

At least one selected from the first and second ferromagnetic layers may have a multi-layer thin film structure formed by alternately stacking a first layer including cobalt (Co) and a second layer including platinum (Pt) or palladium (Pd).

At least one selected from the first and second ferromagnetic layers may be formed of a magnetic material having an $L1_1$ or $L1_0$ type ordered structure.

The first and second ferromagnetic layers may include a crystalline layer.

The magnetic device may further include an amorphous layer between the first ferromagnetic layer and the tunnel barrier layer.

The first and second ferromagnetic layers may be formed as vertical magnetization layers.

The first and second ferromagnetic layers may be formed as horizontal magnetization layers.

The magnetic device may further include an antiferromagnetic (AFM) layer that is separated from the tunnel barrier layer by the second ferromagnetic layer.

The SAF structure may further include a Ru layer that is disposed between the first ferromagnetic layer and the second ferromagnetic layer and contacts the Ru—Rh alloy layer.

The Ru—Rh alloy layer and the Ru layer may include a multi-layer thin film structure formed by alternately stacking the Ru—Rh alloy layer and the Ru layer.

According to another aspect of the inventive concept, there is provided a magnetic device including a free layer including a first magnetization layer; a pinned layer including a second magnetization layer; and a tunnel barrier layer provided between the free layer and the pinned layer, in which at least one selected from the first magnetization layer and the second magnetization layer includes a synthetic antiferromagnetic (SAF) structure formed of a first ferromagnetic layer, a second ferromagnetic layer, and a ruthenium-rhodium (Ru—Rh) alloy layer and a Ru layer provided between the first and second ferromagnetic layers; a switching device connected to any one of the free layer and the pinned layer; and a bit line connected to the other one of the free layer and the pinned layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
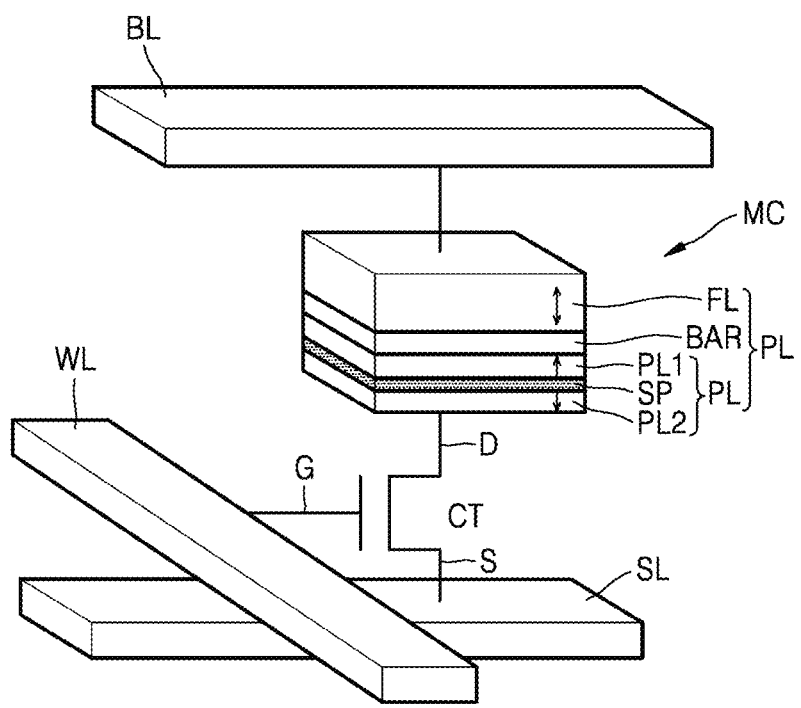
FIG. 1 is a schematic view of a magnetic device, according to some embodiments of the inventive concepts.

The embodiments of the present inventive concept will be described in detail with reference to the accompanying drawings, in which exemplary embodiments of the present inventive concept are shown. Like reference numerals in the drawings denote like elements, and thus their description will be omitted. Expressions such as "at least one of," when preceding a list of elements, modify the entire list of elements and do not modify the individual elements of the list. An expression used in the singular encompasses the expression of the plural, unless it has a clearly different meaning in the context.

The embodiments of the present inventive concept are provided to fully describe the present inventive concept to one of ordinary skill in the art to which the present inventive concept pertains. The embodiments may have different forms and should not be construed as being limited to the descriptions set forth herein. Instead, the embodiments more fully convey the spirit and scope of the present inventive concept to one of ordinary skill in the art.

It will be understood that although the terms "first," "second," etc. may be used herein to describe various members, areas, layers, portions, and/or components, these members, areas, layers, portions, and/or components should not be limited by these terms. These components do not indicate a specific order or superiority, but are only used to distinguish one member, area, layer, portion or component from another. Therefore, first members, areas, portions, or components may indicate second members, areas, portions, or components without departing from teachings of the present inventive concept. For example, a first member, area, portion, or component within the scope of the present inventive concept may be referred to as a second member, area, portion, or component, and vice versa.

Unless defined otherwise, all terms used in the description including technical or scientific terms have the same meaning as commonly understood by one of ordinary skill in the art to which the present inventive concept pertains. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

When a certain embodiment may be implemented differently, a specific process order may be performed differently from the described order. For example, two consecutively described processes may be performed substantially at the same time or performed in an order opposite to the described order.

In the accompanying drawings, the present embodiments may have different forms according to, for example, a manufacturing technology and/or tolerance. Therefore, the embodiments of the present inventive concept should not be construed as being limited to the descriptions set forth herein, but should include, for example modifications created during a manufacturing process.

FIG. 1 is a schematic view of a magnetic device 10, according to some embodiments of the inventive concepts.

Referring to FIG. 1, the magnetic device 10, e.g., a spin transfer torque magnetic random access memory (STT-MRAM) is illustrated.

A memory cell MC of the magnetic device 10 may include a magnetic tunnel junction (MTJ) structure MD and a cell transistor CT. The MTJ structure MD may include a free layer FL, a pinned layer PL, and a tunnel barrier layer BAR disposed between the free layer FL and the pinned layer PL. A bit line BL and a drain electrode D of the cell transistor CT are respectively connected to the free layer FL and the pinned layer PL of the MTJ structure MD. A source electrode S of the cell transistor CT is connected to a source line SL. A gate electrode G of the cell transistor CT is connected to a word line WL. The cell transistor CT may have a metal oxide semiconductor field effect transistor (MOSFET) structure.

The pinned layer PL has a synthetic antiferromagnetic (SAF) structure formed of a first ferromagnetic layer PL1, a second ferromagnetic layer PL2, and a ruthenium-rhodium (Ru—Rh) alloy layer SP disposed between the first and second ferromagnetic layers PL1 and PL2. Although FIG. 1 illustrates that the bit line BL is connected to the free layer FL of the MTJ structure MD and the pinned layer PL of the MTJ structure MD is connected to the drain electrode D of the cell transistor CT, the present inventive concept is not limited thereto. The pinned layer PL may be disposed on the tunnel barrier layer BAR and connected to the bit line BL, and the free layer FL may be disposed under the tunnel bather layer BAR and connected to the drain electrode D of the cell transistor CT. Also, although FIG. 1 illustrates that only the pinned layer PL has the SAF structure, the present inventive concept is not limited thereto, and at least one selected from the free layer FL and the pinned layer PL may be a magnetic device that has the SAF structure.

The MTJ structure MD may function as a data storage device, and the cell transistor CT may function as a switching device. The free layer FL of the MTJ structure MD has a magnetization easy axis that is substantially perpendicular to an extending direction of the free layer FL, and a magnetization direction thereof changes according to external conditions such as an external current or external magnetic field. The magnetization direction of the free layer FL may change according to spin transfer torque (STT). The pinned layer PL has a magnetization easy axis that is substantially perpendicular to an extending direction of the pinned layer PL, and a magnetization direction thereof is fixed. Although FIG. 1 illustrates that a magnetization direction is substantially perpendicular to an extending direction of the free layer FL and the pinned layer PL, the present inventive concept is not limited thereto. The magnetization direction of the pinned layer PL may be substantially horizontal with respect to the extending direction of the pinned layer PL, and the magnetization direction of the free layer FL may be parallel or anti-parallel to the magnetization direction of the pinned layer PL.

A write operation of the magnetic device 10 may be performed by controlling a magnetization alignment of the free layer FL of the MTJ structure MD by using a synthetic magnetic field generated by a current flowing in the bit line BL and a current flowing in the word line WL. Since the magnetization direction of the pinned layer PL is fixed, the magnetization direction of the free layer FL may be controlled by changing a direction of the current flowing in the bit line BL so that the magnetization direction of the free layer FL is parallel or anti-parallel to the magnetization direction of the pinned layer PL. When the respective magnetization directions of the pinned layer PL and the free layer FL are parallel to each other, data '0' may be stored, and when they are anti-parallel to each other, data '1' may be stored.

A read operation of the magnetic device 10 may be performed by using a tunnel magnetoresistance (TMR) effect. A tunnel current flows in the tunnel barrier layer BAR when a voltage is applied to two ends of the MTJ structure MD. The cell transistor CT is allowed to transmit a current, and a magnitude of a voltage drop, i.e., a resistance, generated by the tunnel current is estimated. Then, when resistance is low since the respective magnetization directions of the pinned layer PL and the free layer FL are parallel to each other, data may be read as data '0,' and when resistance is high since the respective magnetization directions thereof are anti-parallel to each other, data may be read as data '1.'

Figure 2A:
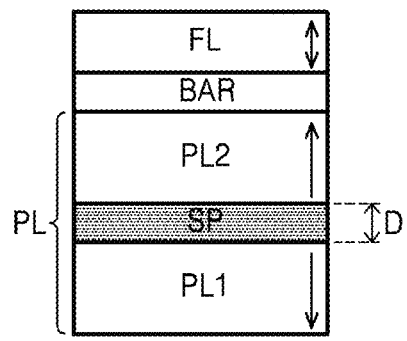
FIGS. 2A and 2B are cross-sectional views of magnetic devices, according to some embodiments of the inventive concepts.
Figure 2B:
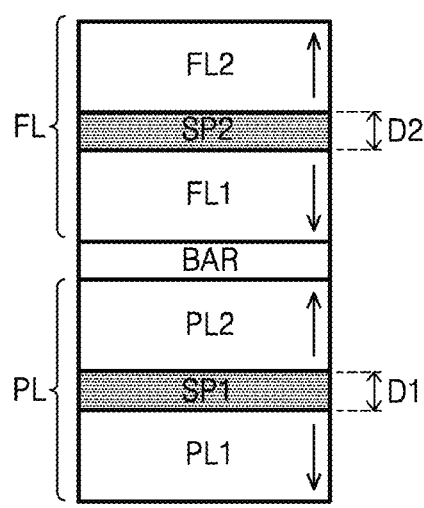

FIGS. 2A and 2B are cross-sectional views of magnetic devices 20 and 25, according to some embodiments of the inventive concepts. Like reference numerals in FIGS. 2A, 2B, 3A, 3B, and 9 to 12 denote like elements.

Referring to FIG. 2A, the magnetic device 20 may include the pinned layer PL, the free layer FL, and the tunnel barrier layer BAR disposed between the pinned layer PL and the free layer FL. The pinned layer PL has the SAF structure formed of the first ferromagnetic layer PL1, the second ferromagnetic layer PL2, and the Ru—Rh alloy layer SP disposed between the first and second ferromagnetic layers PL1 and PL2. The SAF structure has an antiferromagnetic coupling (AFC) property caused by a Ruderman-Kittel-Kasuya-Yosida (RKKY) interaction. The second ferromagnetic layer PL2 has a magnetic moment that is anti-parallel to a magnetic moment of the first ferromagnetic layer PL1, and the first and second ferromagnetic layers PL1 and PL2 are configured in a way that the pinned layer PL and respective magnetization directions thereof do not change. The magnetization direction of the free layer FL may change according to an applied magnetic field. An amount of transmitted current is determined based on whether the magnetization direction of the free layer FL is parallel or anti-parallel to the magnetization direction of the pinned layer PL. The tunnel barrier layer BAR may include a non-magnetic material such as such as magnesium oxide or aluminum oxide.

When the Ru—Rh alloy layer SP is disposed between the first and second ferromagnetic layers PL1 and PL2, and when an external magnetic field is applied, the magnetic device 20 has a greater electric conductivity than when a different transition metal layer is provided. When evaluating a normalized exchange coupling strength of a multi-layer thin film structure formed of a material layer having a hexagonal close packed (HCP) structure, such as a cobalt (Co)-based layer, and a transition metal layer, a multi-layer thin film including Ru and Rh has an exchange coupling strength greater than that of other transition metals, such as iridium (Ir), chrome (Cr), copper (Cu), rhenium (Re), vanadium (V), molybdenum (Mo), tungsten (W), niobium (Nb), and tantalum (Ta). Also, when evaluating a normalized exchange coupling strength of a multi-layer thin film structure formed of a material layer having a body-centered cubic (BCC) structure, such as an iron (Fe)-based layer, and a transition metal layer, a multi-layer thin film including Ru and Rh has an exchange coupling strength greater than that of other transition metals, such as Ir, Cu, Re, Cr, V, Mo, W, Nb, and Ta. This indicates that a strength, which is necessary for synchronizing spin alignments of two ferromagnetic layers that are separated by a non-magnetic layer, is increased when an external magnetic field is applied. Thus, a magnetic device having an SAF structure including a Ru—Rh alloy layer as a non-magnetic layer may have an improved dynamic property.

In some embodiments, the Ru—Rh alloy layer SP may include at least about 1 at % to not more than (or not more than) about 60 at % of Rh, and a remainder thereof may include Ru. In some embodiments, the Ru—Rh alloy layer SP may have an HCP crystalline structure. In some embodiments, the Ru—Rh alloy layer SP may include at least about 1 at % to not more than about 15 at % of at least one element selected from Ir, Re, osmium (Os), Mo, W, Ta, Cr, and Cu. In some embodiments, a thickness of the Ru—Rh alloy layer SP may range from about 3 Å to about 15 Å. In some embodiments, an SAF layer, which includes a Ru—Rh alloy and a Ru layer, may be provided between the first and second ferromagnetic layers PL1 and PL2.

In some embodiments, at least one selected from the first and second ferromagnetic layers PL1 and PL2 may include a multi-layer thin film structure which is formed by alternately stacking a first layer formed of Co and a second layer formed of platinum (Pt) or palladium (Pd). In some embodiments, at least one selected from the first and second ferromagnetic layers PL1 and PL2 may include a Co—Pt alloy or a Co—Pd alloy. In some embodiments, at least one selected from the first and second ferromagnetic layers PL1 and PL2 may be formed of a magnetic material having an $L1_1$ or $L1_0$ ordered structure. In some embodiments, the first and second ferromagnetic layers PL1 and PL2 may include a crystalline material layer, and in some embodiments, an amorphous material layer may be further included between the SAF layer and the tunnel barrier layer BAR. In some embodiments, an antiferromagnetic (AFM) layer, which is separated from the tunnel barrier layer BAR by the pinned layer PL, may be further included.

In some embodiments, the tunnel barrier layer BAR may be formed of oxide of any one material selected from magnesium (Mg), titanium (Ti), aluminum (Al), MgZn, and MgB, Ti nitride, or V nitride. In some embodiments, the tunnel barrier layer BAR may be formed as a single layer or multiple layers formed by sequentially stacking a plurality of layers. For example, the tunnel barrier layer BAR may have a multi-layer structure selected from Mg/MgO, MgO/Mg, and Mg/MgO/Mg. The embodiments will be described in detail below.

Although FIG. 2A illustrates that only the pinned layer PL has the SAF structure, the present inventive concept is not limited thereto, and the free layer FL, the pinned layer PL or both may be a magnetic device that has the SAF structure formed of a first ferromagnetic layer, a second ferromagnetic layer, and a Ru—Rh alloy layer disposed between the first and second ferromagnetic layers.

Referring to FIG. 2B, the magnetic device 25 may include the pinned layer PL that has an SAF structure formed of the first ferromagnetic layer PL1, a first Ru—Rh alloy layer SP1, and the second ferromagnetic layer PL2; and the free layer FL, which is separated from the pinned layer PL by the tunnel barrier layer BAR, has an SAF structure formed of a third ferromagnetic layer FL1, a second Ru—Rh alloy layer SP2, and a fourth ferromagnetic layer FL2. In some embodiments, when the pinned layer PL has the SAF structure, the second Ru—Rh alloy layer SP2 in the free layer FL may be replaced with an alloy layer that includes at least one selected from Ru, Rh, Cr, Ir, Re, Os, Re, V, Mo, Nb, W, and Ta. In some embodiments, in the magnetic device 25, a thickness D1 of first Ru—Rh alloy layer SP1 and a thickness D2 of the second Ru—Rh alloy layer SP2 may each range from about 3 Å to about 15 Å.

Figure 3A:
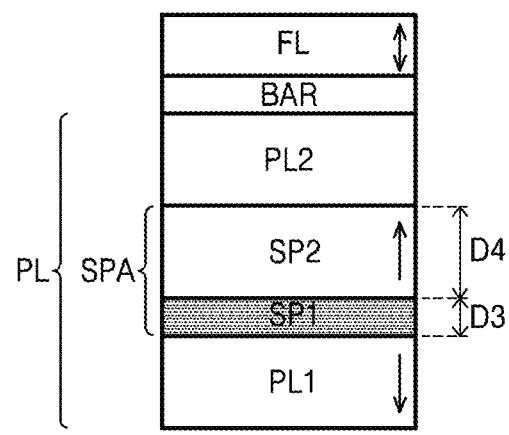
FIGS. 3A and 3B are cross-sectional views of a multi-layer thin film structure including a ruthenium-rhodium (Ru—Rh) alloy layer and a Ru layer in a magnetic device, according to some embodiments of the inventive concepts.
Figure 3B:
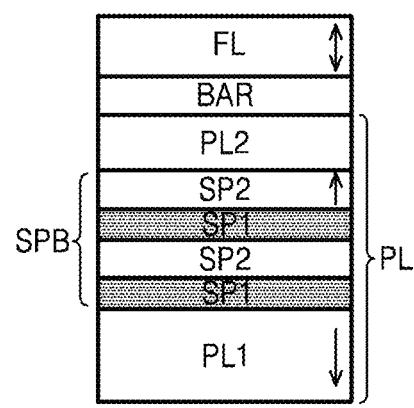

FIGS. 3A and 3B are cross-sectional views of magnetic devices 30 and 35, according to some embodiments of the inventive concepts.

Referring to FIG. 3A, the magnetic device 30 may include the free layer FL, the pinned layer PL, and the tunnel barrier layer BAR disposed between the free layer FL and the pinned layer PL. The pinned layer PL has an SAF structure formed of the first ferromagnetic layer PL1, the second ferromagnetic layer PL2, and a Ru/Ru—Rh alloy composition layer SPA, which is disposed between the first and second ferromagnetic layers PL1 and PL2. The Ru/Ru—Rh alloy composition layer SPA may include a Ru layer SP1 and a Ru—Rh alloy layer SP2 formed on the Ru layer SP1.

The Ru layer SP1 of the Ru/Ru—Rh alloy composition layer SPA may substantially prevent material layers that contact the Ru layer SP1 from spreading to the Ru—Rh alloy layer SP2 during a process performed in the temperature range of 300° C. or above. Accordingly, since an exchange coupling strength of the SAF structure including the Ru—Rh alloy layer SP2 may be maintained at the initial level, the magnetic devices 30 and 35 may be prevented from being deteriorated due to high processing temperatures.

In some embodiments, in the Ru/Ru—Rh alloy composition laser SPA, a thickness D3 of the Ru layer SP1 may range from about 0.5 Å to about 3.5 Å, and a thickness D4 of the Ru—Rh alloy layer SP2 may range from about 0.5 Å to about 10 Å. In some embodiments, the thickness D4 of the Ru—Rh alloy layer SP2 may be greater than the thickness D3 of the Ru layer SP1.

Although FIG. 3A illustrates that the Ru/Ru—Rh alloy composition layer SPA is manufactured by forming the Ru—Rh alloy layer SP2 on the Ru layer SP1, the present inventive concept is not limited thereto. For example, the Ru layer SP1 may be formed on the Ru—Rh alloy layer SP2. In other words, the Ru/Ru—Rh alloy composition layer SPA disposed between the first and second ferromagnetic layers PL1 and PL2 may be manufactured by forming the Ru—Rh alloy layer SP2 between the Ru layer SP1 and the second ferromagnetic layer PL2, or by forming the Ru layer SP1 between the Ru—Rh alloy layer SP2 and the second ferromagnetic layer PL2.

In some embodiments, the Ru layer SP1 of the Ru/Ru—Rh alloy composition layer SPA may be disposed to contact one of the first and second ferromagnetic layers PL1 and PL2, which spread itself more actively.

Referring to FIG. 3B, the magnetic device 35 includes the free layer FL, the pinned layer PL, and the tunnel barrier layer BAR disposed between the free layer FL and the pinned layer PL. The pinned layer PL has an SAF structure formed of the first ferromagnetic layer PL1, the second ferromagnetic layer PL2, and a Ru/Ru—Rh alloy composition layer SPB, which is disposed between the first and second ferromagnetic layers PL1 and PL2 and formed by alternately stacking the Ru—Rh alloy layer SP2 and the Ru layer SP1. In some embodiments, the Ru/Ru—Rh alloy composition layer SPB may be formed by alternately stacking the Ru—Rh alloy layer SP2 and the Ru layer SP1 three times or more.

Figure 4:
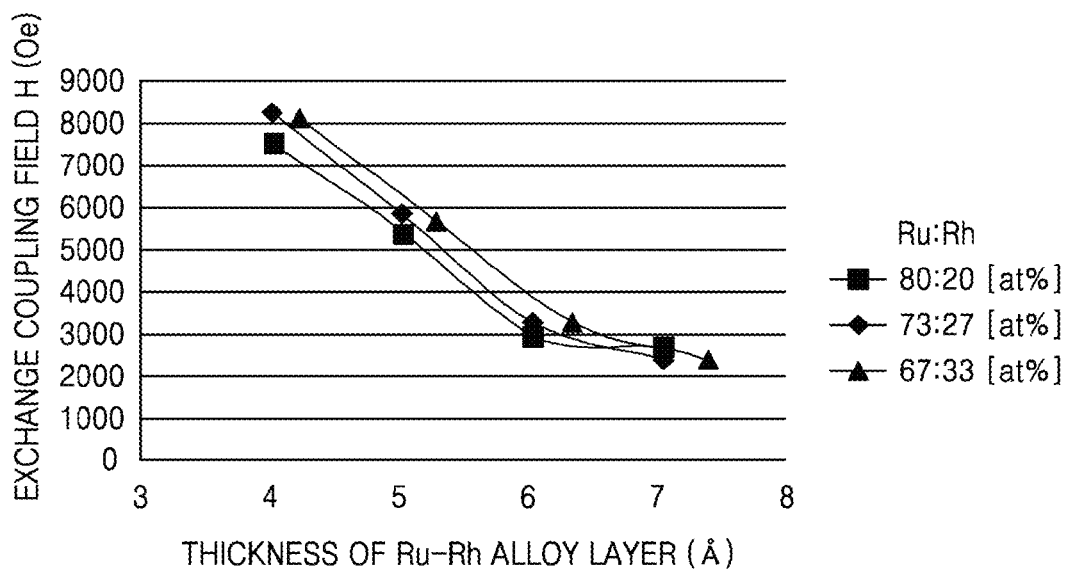
FIG. 4 is a graph of an exchange coupling field with respect to a thickness of a Ru—Rh alloy layer in a magnetic device, according to some embodiments of the inventive concepts.

FIG. 4 is a graph of an exchange coupling field with respect to a thickness of a Ru—Rh alloy layer in a magnetic device, according to some embodiments of the inventive concept.

Referring to FIG. 4 and referring back to FIG. 2A, FIG. 4 shows a magnitude H of an exchange coupling field with respect to the thickness D of the Ru—Rh alloy layer SP when a composition ratio between Ru and Rh for forming the Ru—Rh alloy layer SP is about 80 at % to about 20 at %, about 73 at % to about 27 at %, and about 67 at % to about 33 at %. When the thickness D of the Ru—Rh alloy layer SP is small, ranging from about 4 Å to about 5 Å, the magnitude H of the exchange coupling field is large. Although not shown in FIG. 4, the magnitude H of the exchange coupling field oscillates according to the thickness D of the Ru—Rh alloy layer SP and has peaks set around about 4 Å, about 8 Å, and about 12 Å. Thus, the thickness D of the Ru—Rh alloy layer SP may be set according to a required magnitude of the exchange coupling field to thus form the Ru—Rh alloy layer SP. In some embodiments, the thickness D of the Ru—Rh alloy layer SP in the magnetic device 10 may range from about 3 Å to about 15 Å.

Figure 5:
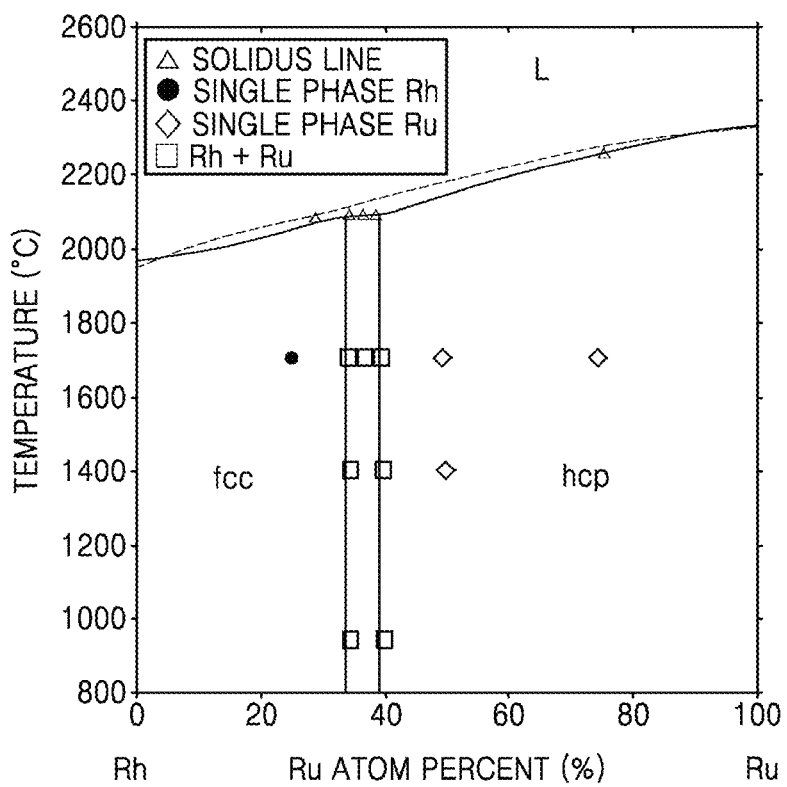
FIG. 5 is a phase equilibrium diagram with respect to a composition ratio of a Ru—Rh alloy layer in a magnetic device, according to some embodiments of the inventive concepts.

FIG. 5 is a phase equilibrium diagram with respect to a composition ratio of a Ru—Rh alloy layer in a magnetic device, according to some embodiments of the inventive concept.

Referring to FIG. 5, the diagram shows phase differences with respect to a crystalline structure and temperatures according to a composition ratio between Ru and Rh that configure the Ru—Rh alloy layer. A Ru—Rh alloy layer (◇) having Ru of about 40 at % or above, i.e., Rh of about 60 at % or below, behaves like a single phase Ru, and thus may be regarded as having an HCP crystalline structure. A Ru—Rh alloy layer (•) having Ru of about 34 at % or below, i.e., Rh of about 66 at % or above, behaves like a single phase Rh, and thus may be regarded as having a face-centered cubic (FCC) crystalline structure.

In a Ru—Rh alloy layer (□), having a composition ratio where Ru is at least about 34 at % and not more than about 40 at % and Rh is at least about 60 at % and not more than about 66%, may not behave like a single phase because a crystalline structure of Ru and a crystalline structure of Rh may not be fused enough.

The phase equilibrium diagram shows a solid phase line (Δ) of the Ru—Rh alloy layer, which may be an index for understanding thermal tolerance of the HCP crystalline structure and the FCC crystalline structure. Since a melting point is higher in the HCP crystalline structure than the FCC crystalline structure FCC, the Ru—Rh alloy layer having the HCP crystalline structure has a higher thermal tolerance than the Ru—Rh alloy layer having the FCC crystalline structure. The Ru—Rh alloy layer having higher thermal tolerance does not spread excessively due to high processing temperatures, and thus increase reliability of the magnetic device. However, although the Ru—Rh alloy layer shows greater thermal tolerance when a smaller amount of Rh is included therein, the Ru—Rh alloy layer spreads less than a layer including only Ru at about 300° C. or below. Thus, the Ru—Rh alloy layer has more advantages compared to the layer including only Ru.

In some embodiments, in the magnetic device 10, the Ru—Rh alloy layer SP may include at least about 1 at % to not more than about 60 at % of Rh, and the remainder thereof may include a Ru alloy.

In some embodiments, in the magnetic device 10, the Ru—Rh alloy layer SP may have an HCP crystalline structure.

Figure 6A:
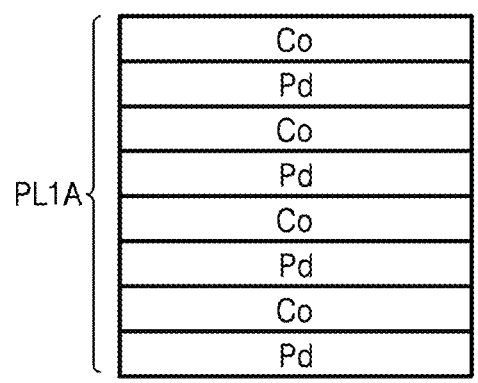
FIGS. 6A and 6B are cross-sectional views of a multi-layer thin film structure of a ferromagnetic layer in a magnetic device, according to some embodiments of the inventive concepts.
Figure 6B:
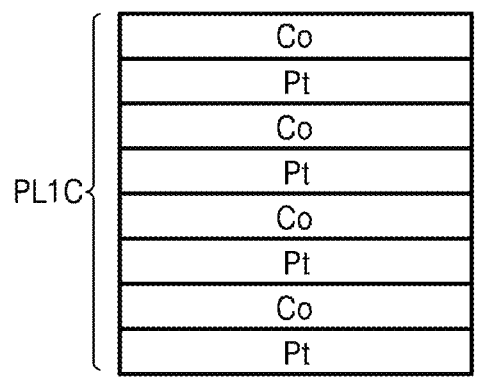

FIGS. 6A and 6B are cross-sectional views of a multi-layer thin film structure of a ferromagnetic layer in a magnetic device, according to some embodiments of the inventive concept.

Referring to FIG. 6A, a first ferromagnetic layer PL1A having a multi-layer thin film structure formed by alternately stacking, a plurality of first layers including Co and a plurality of second layers including Pd, a plurality of times.

Referring to 6B, a first ferromagnetic layer PL1B having a multi-layer thin film structure formed by alternately stacking, a plurality of first layers including Co and a plurality of second layers including Pt, a plurality of times.

Referring back to FIG. 2A, instead of the first ferromagnetic layer PL1, the magnetic device 20 may include first ferromagnetic layer PL1A having the multi-layer thin film structure of FIG. 6A or the first ferromagnetic layer PL1B having the multi-layer thin film structure of FIG. 6B.

Although FIGS. 6A and 6B illustrate the multi-layer thin film structure formed of the plurality of first layers including Co and the plurality of second layers including Pt or Pd, the present inventive concepts are not limited thereto. In some embodiments, the plurality of first layers may include Co and impurities and the plurality of second layers may include impurities and Pt or Pd.

In some embodiments, the plurality of first and second layers may each have a thickness of about 1 Å to about 5 Å.

Figure 7A:
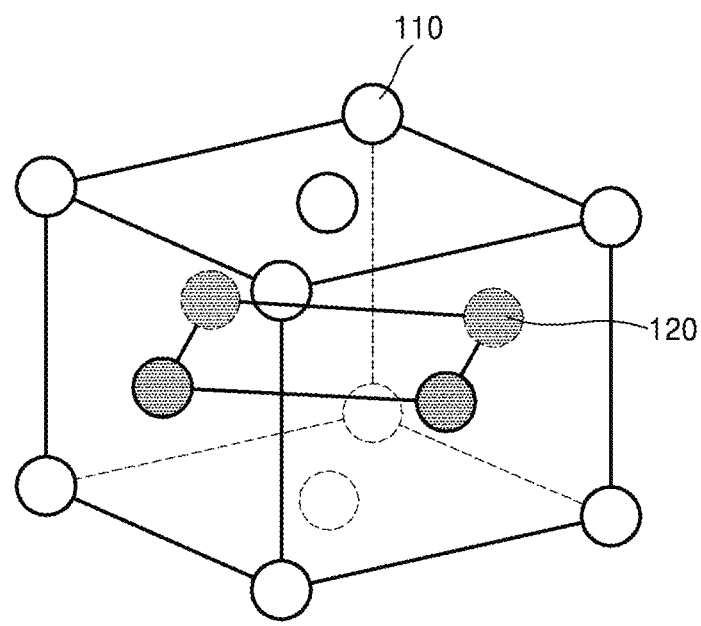
FIGS. 7A and 7B are schematic perspective views of an ordered structure of a ferromagnetic layer in a magnetic device, according to some embodiments of the inventive concepts.
Figure 7B:
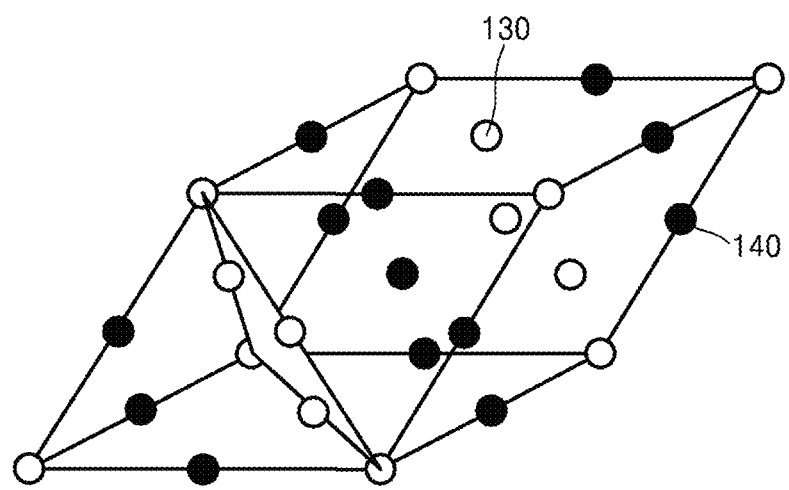

FIGS. 7A and 7B are schematic perspective views of an ordered structure of a ferromagnetic layer in a magnetic device, according to some embodiments of the inventive concepts.

In the magnetic device 10 illustrated in FIG. 2A, at least one selected from the first and second ferromagnetic layers PL1 and PL2 may be formed of a magnetic material having an $L1_0$ or $L1_1$ ordered structure.

Referring to FIG. 7A, at least one selected from the first and second ferromagnetic layers PL1 and PL2 of the magnetic device 10 may be formed as a vertical magnetization pinned layer created by alternately forming a first layer formed of first atoms 110 and a second layer formed of second atoms 120. In some embodiments, at least one selected from the first and second ferromagnetic layers PL1 and PL2 may be formed as a Co-based vertical magnetization pinned layer having an $L1_0$ ordered structure. For example, the first atom 110 may be Co, and the second atom 120 may be Pt or Pd. Alternatively, at least one selected from the first and second ferromagnetic layers PL1 and PL2 may be formed of at least one selected from materials that have an $L1_0$ ordered structure and include $Fe_{50}Pt_{50}$, $Fe_{50}Pd_{50}$, or $Fe_{50}Ni_{50}$.

Referring to FIG. 7B, at least one selected from the first and second ferromagnetic layers PL1 and PL2 of the magnetic device 10 may be formed as a vertical magnetization pinned layer created by alternately forming a first layer formed of first atoms 130 and a second layer formed of second atoms 140. In some embodiments, at least one selected from the first and second ferromagnetic layers PL1 and PL2 may be formed as a Co-based vertical magnetization pinned layer having an $L1_1$ ordered structure. For example, the first atoms 130 may be Co, and the second atoms 140 may be Pt or Pd.

Figure 8A:
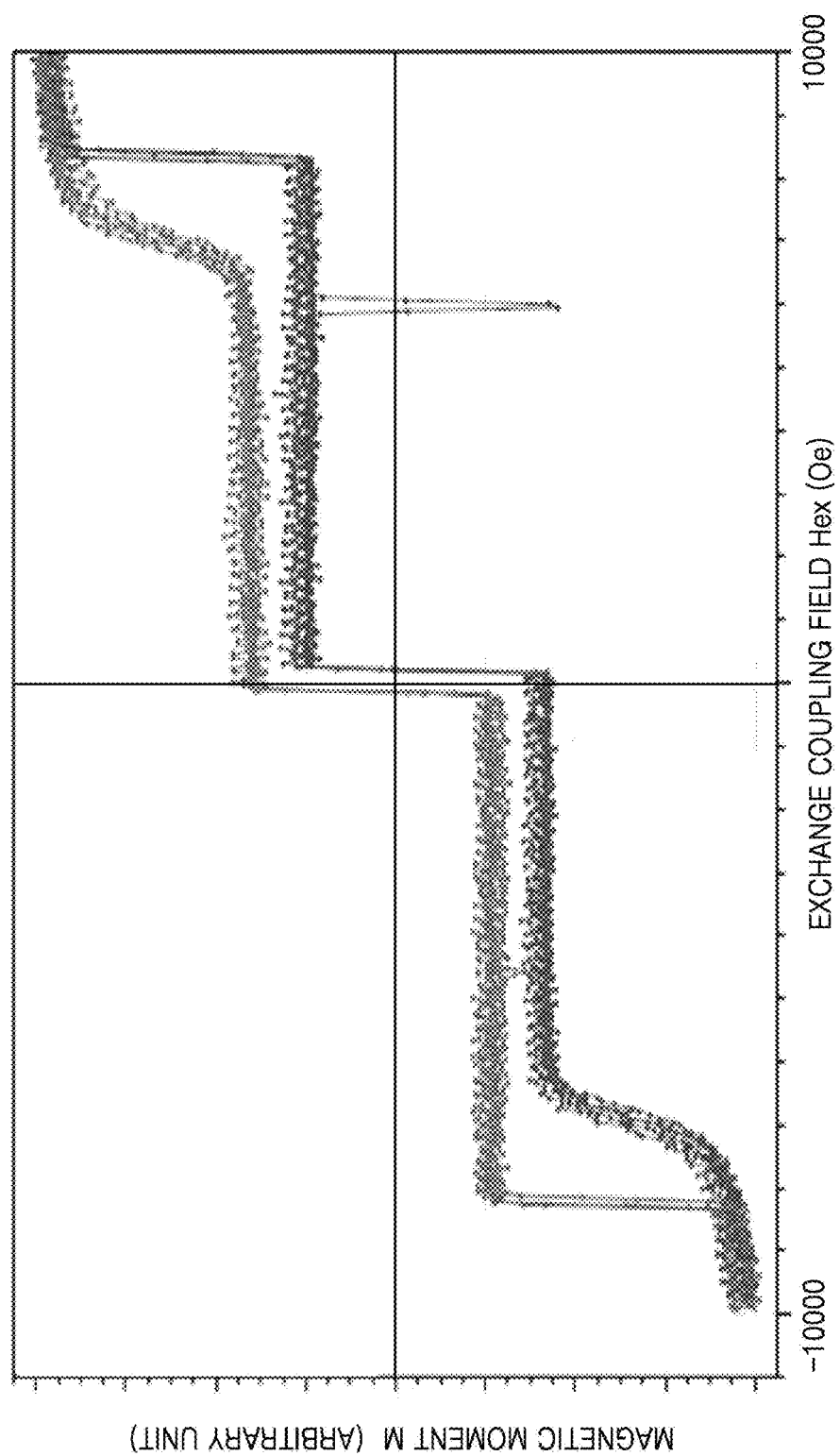
FIGS. 8A and 8B are graphs of a magnetic moment with respect to an exchange coupling field of a magnetic field, according to some embodiments of the inventive concepts.
Figure 8B:
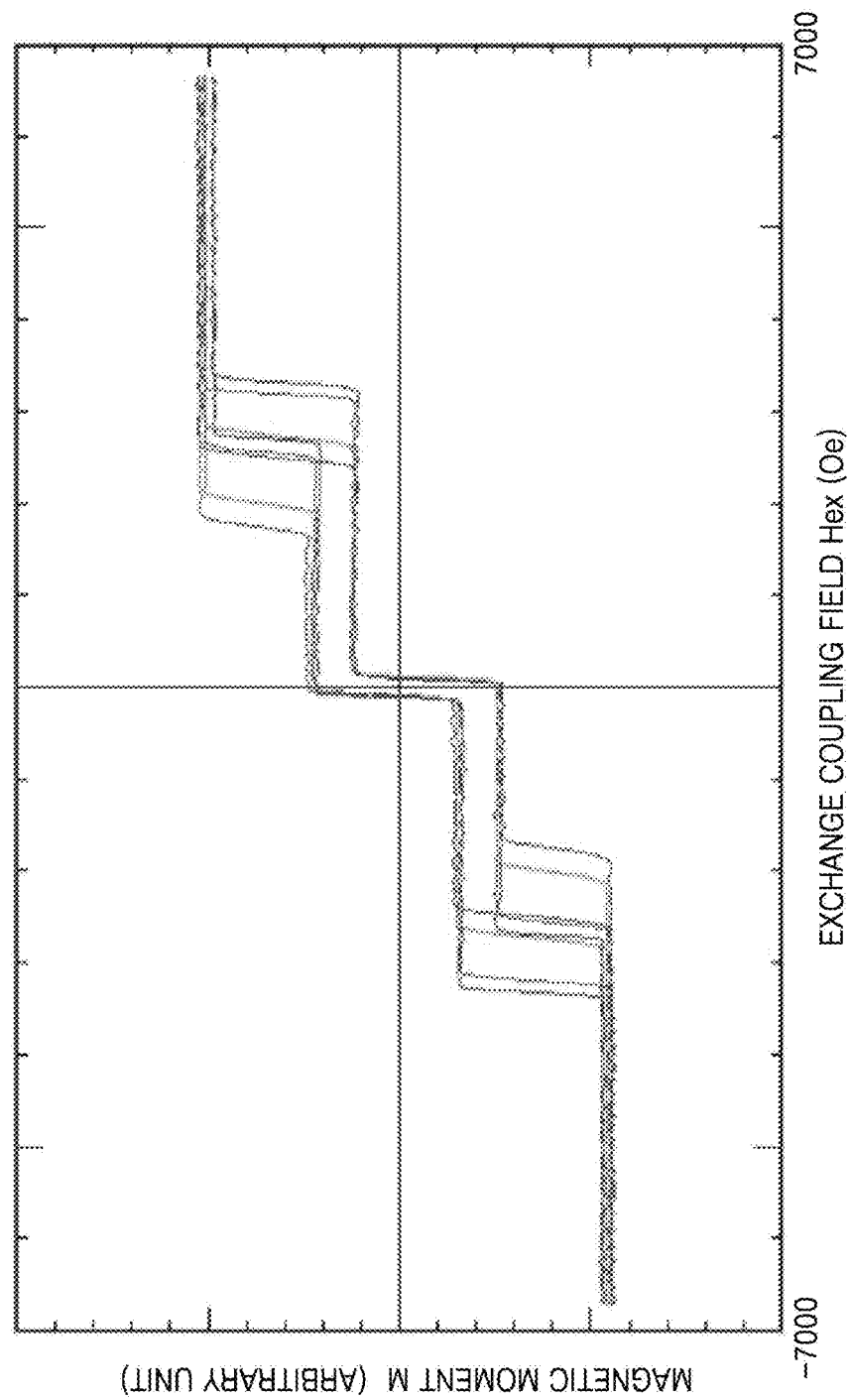

FIGS. 8A and 8B are graphs of a magnetic moment with respect to an exchange coupling field of a magnetic field, according to some embodiments of the inventive concepts. FIGS. 8A and 8B show effective ranges of an exchange coupling field of the magnetic device 10 that includes the Ru—Rh alloy layer SP.

FIG. 8A shows a magnetic moment M with respect to an exchange coupling field Hex obtained after annealing a Ru—Rh alloy layer, of which a composition ratio between Ru and Rh is about 67 at % to about 33 at %, at about 300° C. for two hours. When a Ru layer is formed as a non-magnetic layer between ferromagnetic layers, the magnetic moment M is effective in an exchange coupling field Hex range of about −4.5 KOe to about 4.5 KOe. However, according to the present inventive concepts, when the Ru—Rh alloy layer is formed between the ferromagnetic layers, the magnetic moment M may be effective in an exchange coupling field Hex range of about −7.0 KOe to about 7.0 KOe.

FIG. 8B shows a magnetic moment M with respect to an exchange coupling field Hex obtained after annealing a Ru—Rh alloy layer, of which a composition ratio between Ru and Rh is about 67 at % to about 33 at %, at about 350° C. for one hour. When an annealing process in which temperature is increased to improve crystallizability of an antiferromagnetic (AFM) layer is performed, a range of exchange coupling field Hex in which an effective magnetic moment M may be obtained is reduced due to the spreading of a material layer. When a Ru layer is formed as a non-magnetic layer between ferromagnetic layers, the magnetic moment M is effective in an exchange coupling field Hex range of about −3.0 KOe to about 3.0 KOe. However, according to some embodiments, when the Ru—Rh alloy layer is formed between the ferromagnetic layers, the magnetic moment M is effective in an exchange coupling field Hex range of about −3.5 KOe to about 3.5 KOe.

Figure 9:
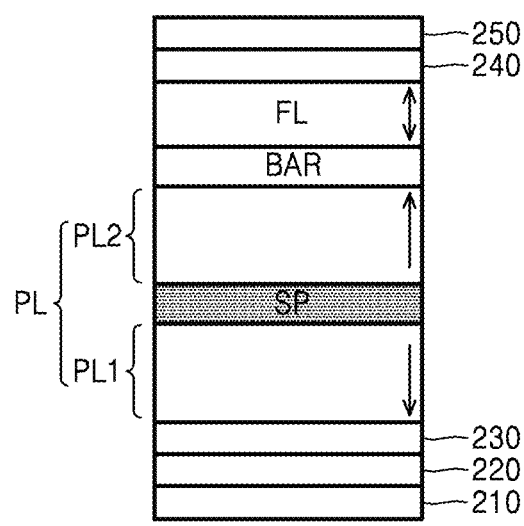
FIGS. 9 to 13 are cross-sectional views of magnetic devices, according to some embodiments of the inventive concepts.

FIG. 9 is a cross-sectional view of a magnetic device 40, according to some embodiments of the present inventive concepts.

Referring to FIG. 9, the magnetic device 40 may include a lower electrode 210, a buffer layer 220 that contacts the lower electrode 210, a seed layer 230 that contacts the buffer layer 220, and a first ferromagnetic layer PL1 formed on the seed layer 230. The first ferromagnetic layer PL1, a second ferromagnetic layer PL2, and a Ru—Rh alloy layer SP configure a pinned layer PL.

In order to obtain sufficient magnetization characteristics in the first ferromagnetic layer PL1, a material forming the lower electrode 210 and a material forming the first ferromagnetic layer PL1 need to match (e.g., providing a good lattice match) each other. The buffer layer 220, which is disposed between the lower electrode 210 and the seed layer 230, matches a crystalline structure of the lower electrode 210 to a crystalline structure of the seed layer 230, and controls a crystalline axis of the seed layer 230 such that a vertical orientation of the seed layer 230 increases. The seed layer 230 controls the first ferromagnetic layer PL1 such that the first ferromagnetic layers PL1 is formed as a superlattice with a long range order.

In some embodiments, the lower electrode 210 may be formed of metal or metal oxide. For example, the lower electrode 210 may be formed of TiN having relatively small amount of nitrogen (N) so as to have a low wiring resistance.

In some embodiments, the buffer layer 220 may include a layer formed of Ti, zirconium (Zr), hafnium (Hf), yttrium (Y), scandium (Sc), or Mg, or an amorphous alloy layer including Co. For example, the buffer layer 220 may include a thin film formed of CoZr, CoHf, or CoFeBTa. In some embodiments, the seed layer 230 may include a Ru layer. In some embodiments, the lower electrode 210, the buffer layer 220, and the seed layer 230 may have a substantially identical crystalline structure. For example, the lower electrode 210, the buffer layer 220, and the seed layer 230 may each have an HCP crystalline structure.

The Ru—Rh alloy layer SP formed on the first ferromagnetic layer PL1 and the second ferromagnetic layer PL2 formed on the Ru—Rh alloy layer SP form the SAF structure. The tunnel barrier layer BAR is formed on the SAF structure and the free layer FL is formed on the tunnel barrier layer BAR. The first ferromagnetic layer PL1, the Ru—Rh alloy layer SP, the second ferromagnetic layer PL2, the tunnel barrier layer BAR, and the free layer FL in the magnetic device 40 may have every respective characteristic of the first ferromagnetic layer PL1, the Ru—Rh alloy layer SP, the second ferromagnetic layer PL2, the tunnel barrier layer BAR, and the free layer FL described with reference to FIGS. 2 to 8.

A protection layer 240 may be formed on the free layer FL. The protection layer 240 may include at least one material selected from Ta, Al, Cu, gold (Au), silver (Ag), Ti, TaN, and TiN. An upper electrode 250 is formed on the protection layer 240. In some embodiments, the upper electrode 250 may be formed of metal or metal oxide.

Figure 10:
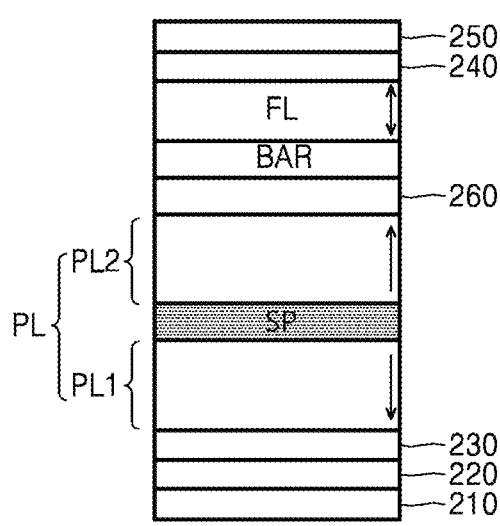

FIG. 10 is a cross-sectional view of a magnetic device 50, according to some embodiments of the present inventive concepts.

Referring to FIG. 10, unlike the magnetic device 40 of FIG. 9, the magnetic device 50 includes the first ferromagnetic layer PL1 and the second ferromagnetic layer PL2 include crystalline material layers, and may further include an amorphous layer 260 on the second ferromagnetic layer PL2. When the Ru—Rh alloy layer SP is used as the non-magnetic layer in the SAF structure, in an annealing temperature range of 300° C. and less, even if the second ferromagnetic layer PL2 includes any one of the crystalline material layer and an amorphous material layer, the diffusion of a material layer in the SAF structure or in the magnetic device 40 can be reduced. Thus, a magnetic device with strong thermo-tolerance may be manufactured. However, in an annealing temperature range of at least about 300° C. and not more than about 350° C., the diffusion of the material layer in the SAF structure or in the magnetic device 40 may be reduced when the second ferromagnetic layer PL2 includes the crystalline material layer. Since the Ru—Rh alloy layer SP spreads less with the crystalline material layer, the ferromagnetic layers PL1 and PL2 that contact the Ru—Rh alloy layer SP may be formed as crystalline material layers. The amorphous layer 260 may be additionally provided on the second ferromagnetic layer PL2 that includes the crystalline material layer so that spreading of the material layer is further reduced. In this case, the amorphous layer 260 may improve properties of the tunnel barrier layer BAR. In some embodiments, the first and second ferromagnetic layers PL1 and PL2 may include a Co-based or Co-alloy based crystalline material layer. In some embodiments, the amorphous layer 260 may include a CoFeB-based amorphous material layer.

Figure 11:
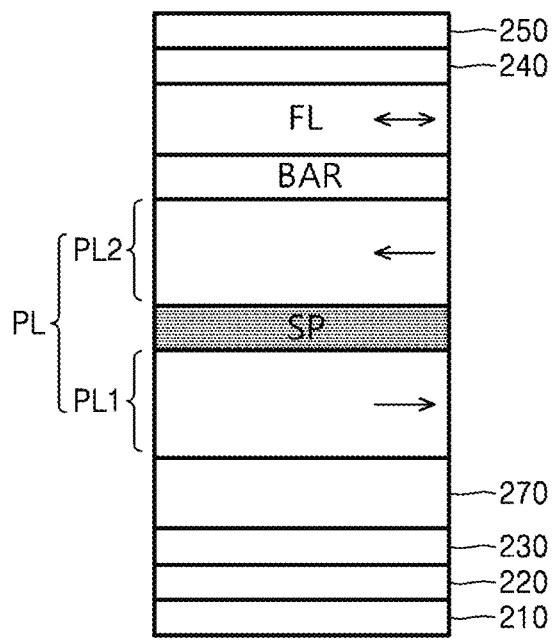

FIG. 11 is a cross-sectional view of a magnetic device 60, according to some embodiments of the present inventive concepts.

Referring to FIG. 11, unlike the magnetic device 40 of FIG. 9, the magnetic device 60 further includes an AFM layer 270 disposed between the seed layer 230 and the first ferromagnetic layer PL1. The AFM layer 270 may firmly fix a magnetization direction of the first ferromagnetic layer PL1 by being antiferromagnetic-coupled with the first ferromagnetic layer PL1. In particular, when the first ferromagnetic layer PL1 is to be fixed in a horizontal magnetization direction, the AFM layer 270 may be necessary.

In some embodiments, when the first ferromagnetic layer PL1 is fixed in the vertical magnetization direction, the AFM layer 270 may be omitted.

Although FIG. 11 illustrates that the AFM layer 270 is formed on the seed layer 230, the present inventive concepts are not limited thereto, and the AFM layer 270 may be formed such that the AFM layer 270 contacts an interface that is not adjacent to the free layer FL, from among two interfaces of the pinned layer PL.

Figure 12:
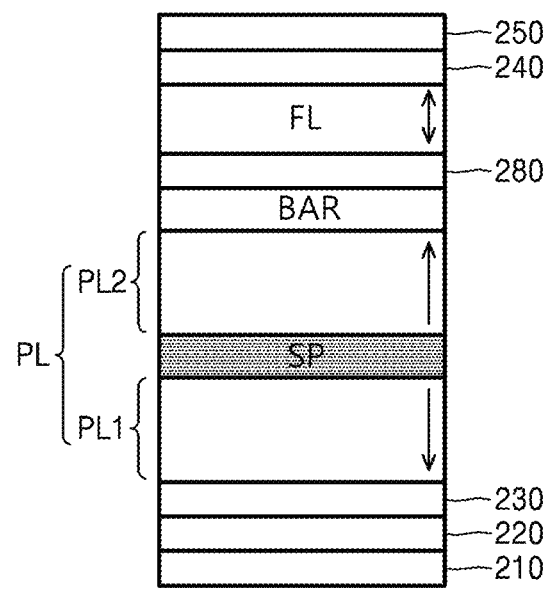

FIG. 12 is a cross-sectional view of a magnetic device 70, according to some embodiments of the present inventive concepts.

Referring to FIG. 12, a polarization strengthening layer 280 for increasing a spin polarization of the free layer FL may be disposed between the tunnel barrier layer BAR and the free layer FL. The polarization strengthening layer 280 may increase a spin polarization of the free layer FL. A magnetization direction of the polarization strengthening layer 280 may be the same as a magnetization direction of the second ferromagnetic layer PL2.

The polarization strengthening layer 280 may include a ferromagnetic material selected from Co, Fe, and Ni. For example, the polarization strengthening layer 280 may be formed of a CoFeB magnetic layer. The polarization strengthening layer 280 may have a high spin polarization rate and a low damping constant. In some embodiments, the polarization strengthening layer 280 may further include a non-magnetic material selected from boron (B), zinc (Zn), Ru, Ag, Au, Cu, carbon (C), and N.

In some embodiments, a magnetic device may include a polarization strengthening layer between the second ferromagnetic layer PL2 and the tunnel barrier layer BAR. A magnetization direction of the polarization strengthening layer may be the same as the magnetization direction of the second ferromagnetic layer PL2.

Figure 13:
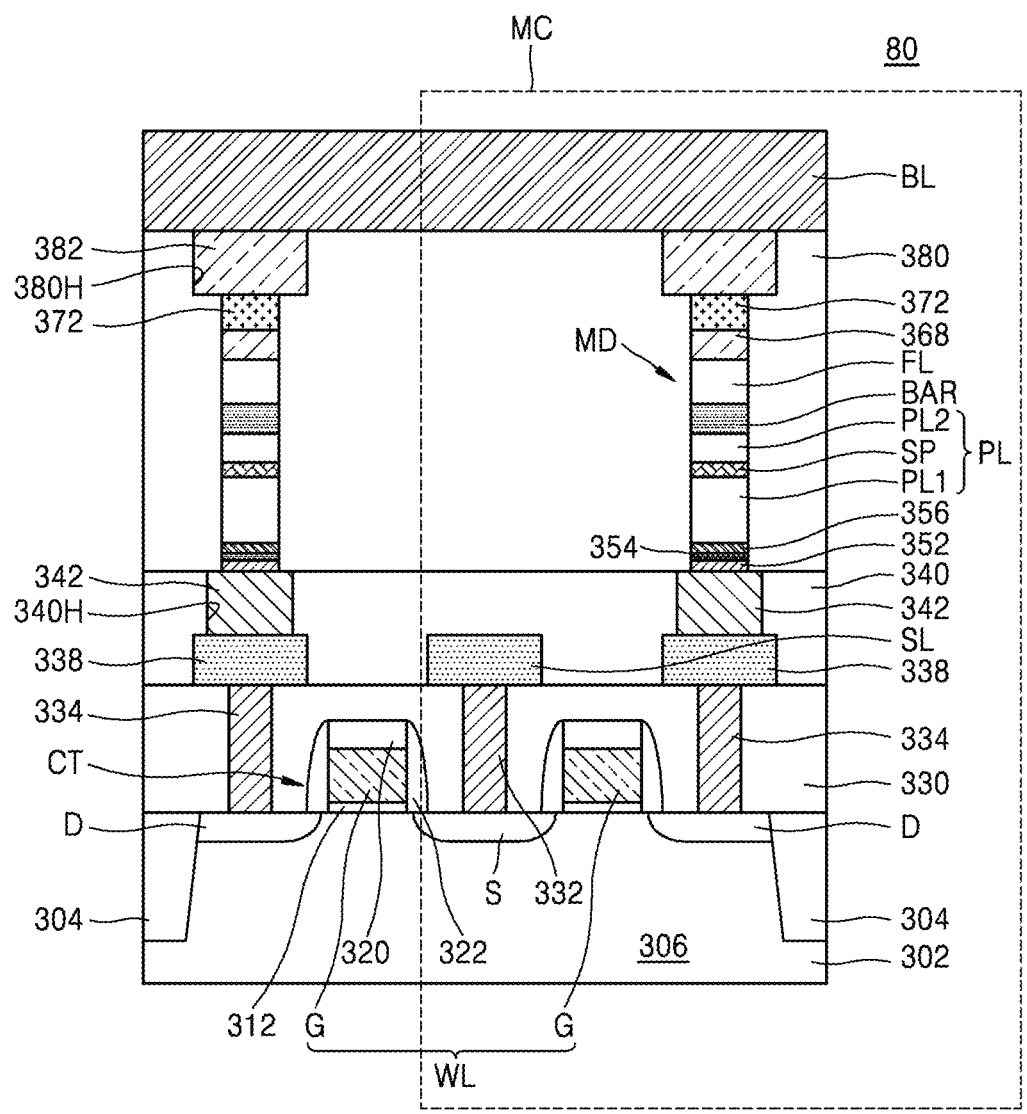

FIG. 13 is a cross-sectional view for describing a method of manufacturing a magnetic device 80, according to some embodiments of the present inventive concepts.

Referring to FIG. 13, a device isolation layer 304 is formed on a substrate 302 to thus define an active region 306. In some embodiments, the substrate 302 is a semiconductor wafer. The substrate 302 may include silicon (Si). Alternatively, the substrate 302 may include a semiconductor element such as germanium (Ge), or a semiconductor compound such as SiC, GaAs, InAs, and InP. Alternatively, the substrate 302 may have a silicon-on-insulator (SOI) structure. For example, the substrate 302 may include a buried oxide (BOX) layer. In some embodiments, the substrate 302 may include a conductive region, e.g., a well doped with impurities or a structure doped with impurities. The device isolation layer 304 may have a shallow-trench-isolation (STI) structure.

A cell transistor CT may be formed in the active region 306. The cell transistor CT includes a gate insulating layer 312, a gate electrode G, a source region S, and a drain region D. An upper surface and two sides of each of the gate electrode G are insulated by an insulating capping pattern 320 and an insulating spacer 322.

On the substrate 302, a first interlayer insulating layer 330, which is planarized and covers the cell transistor CT, a first contact plug 332, which penetrates the first interlayer insulating layer 330 and is electrically connected to the source region S, and a second contact plug 334, which are electrically connected to the drain region D, are formed. After forming a conductive layer on the first interlayer insulating layer 330 and patterning the conductive layer, a source line SL, which is electrically connected to the source region S via the first contact plug 332, and a conductive pattern 338, which is disposed on both sides of the source line SL and electrically connected to the drain region D via the second contact plug 334, may be formed.

A second interlayer insulating layer 340 may be formed on the first interlayer insulating layer 330 to cover the source line SL and the conductive pattern 338. By using a photolithography process, a lower electrode contact hole 340H is formed by removing a portion of the second interlayer insulating layer 340 such that an upper portion of the conductive pattern 338 are exposed. A lower electrode contact plug 342 is formed by filling the lower electrode contact hole 340H with a conductive material, and then grinding the conductive material such that an upper surface of the second interlayer insulating layer 340 is exposed. In some embodiments, the lower electrode contact plug 342 may include at least one material selected from TiN, Ti, TaN, Ta, and W.

A lower electrode layer 352 may be formed on the second interlayer insulating layer 340 and the lower electrode contact plug 342. In some embodiments, the lower electrode layer 352 is formed of metal or metal oxide. For example, the lower electrode layer 352 may be formed of TiN. In order to form the lower electrode layer 352, a chemical vapor deposition (CVD) method, a physical vapor deposition (PVD) method, an atomic layer deposition (ALD) method, or a reactive pulsed laser deposition (PLD) method may be used.

A buffer layer 354 may be formed on the lower electrode layer 352. The buffer layer 354 may be disposed between the lower electrode layer 352 and seed layer 356 and match a crystalline structure of the lower electrode layer 352 to a crystalline structure of the seed layer 356. For example, the buffer layer 354 may be formed of Ta.

The seed layer 356 is formed on the buffer layer 354. The seed layer 356 may include a Ru layer, a Pt layer, or a Pd layer. The seed layer 356 may be formed by using the CVD method, the PVD method, the ALD method, or the reactive PLD method. In some embodiments, the seed layer 356 may be formed by using a DC magnetron sputtering method in which krypton (Kr) is used for sputtering gas.

A pinned layer PL having an SAF structure is formed by sequentially forming a first ferromagnetic layer PL1, a Ru—Rh alloy layer SP, and a second ferromagnetic layer PL2 on the seed layer 356. The first ferromagnetic layer PL1, the Ru—Rh alloy layer SP, and the second ferromagnetic layer PL2 may be formed by using a molecular beam epitaxial (MBE) method or a metal organic CVD method. The first ferromagnetic layer PL1, the Ru—Rh alloy layer SP, and the second ferromagnetic layer PL2 may be formed at a relatively low processing temperature, in a range between about 200° C. and about 400° C. The pinned layer PL of FIG. 13 formed of the first ferromagnetic layer PL1, the Ru—Rh alloy layer SP, and the second ferromagnetic layer PL2 correspond to the pinned layer PL having the SAF structure formed of the first ferromagnetic layer PL1, the Ru—Rh alloy layer SP, and the second ferromagnetic layer PL2 described with reference to FIGS. 1 to 12.

A tunnel barrier layer BAR is formed on the pinned layer PL. The tunnel barrier layer BAR may be formed by using oxide of any one material Mg, Ti, Al, MgZn, and MgB, Ti nitride, V nitride, or a combination thereof. Although not illustrated in FIG. 13, a polarization strengthening layer may be additionally formed on the pinned layer PL before forming the tunnel barrier layer BAR, as in the magnetic device 70 of FIG. 12. The polarization strengthening layer may be formed of a CoFeB magnetic layer. A thickness of the polarization strengthening layer may range from about 10 Å to 20 Å.

A free layer FL is formed on the tunnel barrier layer BAR. Although not illustrated in FIG. 13, as in the magnetic device 30 of FIG. 2B, the free layer FL may include an SAF structure that is formed of a first ferromagnetic layer, a non-magnetic layer, and a second ferromagnetic layer.

A capping layer 368 is formed on the free layer FL. The capping layer 368 may include at least one selected from Ta, Al, Cu, Au, Ti, TaN and TiN. In some embodiments, the capping layer 368 may be omitted.

A stacked structure, including sequentially stacked elements from the lower electrode layer 352 to the capping layer 368, is not limited to the above-described example, and may be modified within the spirit and scope of the present inventive concepts. For example, instead of the above-described stacked structure, the magnetic device 80 may include any one selected from the magnetic devices 10, 20, 25, 30, 35, 40, 50, 60, and 70 described with reference to FIGS. 1, 2A, 2B, 3A, 3B, and 9 to 12. According to some embodiments of the present inventive concepts, various layers may be added or replaced in the stacked structure depending on a property required in a magnetic device.

A conductive mask pattern 372 may be formed on the stacked structure. The conductive mask pattern 372 may be formed of metal or metal nitride. In some embodiments, the conductive mask pattern 372 includes at least one selected from Ru, W, TiN, TaN, Ti, Ta, and a metallic glass alloy.

A magnetic device MD is formed by etching the stacked structure by using the conductive mask pattern 372 as an etching mask. In some embodiments, in order to etch the stacked structure, a plasma etching process may be performed after loading a product including the conductive mask pattern 372 in a plasma etching chamber. Also, a reactive ion etching (RIE) method, an ion beam etching (IBE) method, or an argon (Ar) milling method may be used. A process of etching the stacked structure may be performed by using plasma formed from an inductively coupled plasma (ICP) source, a capacitive coupled plasma (CCP), an electron cyclotron resonance (ECR) source, a helicon-wave excited plasma (HWEP) source, or an adaptively coupled plasma (ACP) source. While the process of etching the stacked structure is being performed, a portion of the conductive mask pattern 372 may be removed from an upper surface thereof due to the etching, and thus a thickness of the conductive mask pattern 372 may be reduced.

The magnetic device MD is formed on the lower electrode contact plug 342 by etching the stacked structure. In the magnetic device MD, the remainder of the conductive mask pattern 372 and the capping layer 368 may function as upper electrodes.

A third interlayer insulating layer 380, which is planarized and covers the magnetic device MD, is formed. A bit line contact hole 380H may be formed by etching a portion of the third interlayer insulating layer 380 such that an upper surface of the conductive mask pattern 372 in the magnetic device MD is exposed. Then, a bit line contact plug 382 is formed in the bit line contact hole 380H by forming a conductive layer that fill the bit line contact hole 380H, and then by grinding or etching back the conductive layers until an upper surface of the third interlayer insulating layer 380 is exposed.

A bit line BL, which is in the form of a line and electrically connected to the bit line contact plug 382, may be formed by forming a conductive layer for forming a bit line BL on the third interlayer insulating layer 380 and the bit line contact plug 382, and then patterning the conductive layer. Accordingly, the fabrication of the magnetic device 80 is completed.

Figure 14:
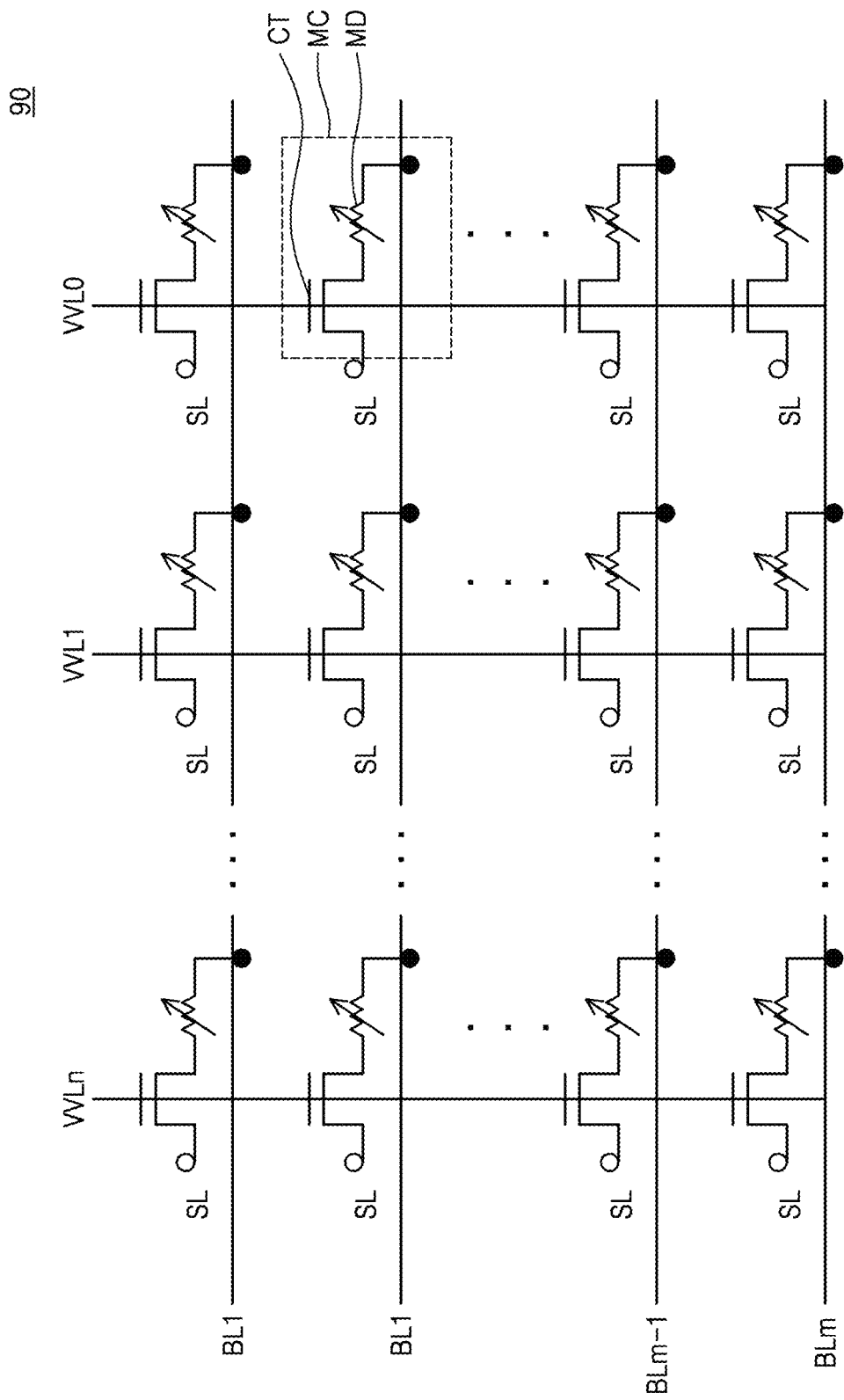
FIG. 14 is a circuit diagram of a memory cell array of a magnetic memory device, according to some embodiments of the inventive concepts.

FIG. 14 is a circuit diagram of a memory cell array of a magnetic memory device 90, according to some embodiments of the inventive concepts.

Referring to FIG. 14, the magnetic memory device 90 may include a plurality of word lines WL0 to WLn, a plurality of bit lines BL0 to BLm, and at least one memory cell MC disposed at each intersection between the plurality of word lines WL0 to WLn and the plurality of bit lines BL0 to BLm.

The at least one memory cell MC may include a switching device such as a cell transistor CT and a magnetic device MD. The magnetic device MD may be at least one selected from the magnetic devices 10, 20, 25, 30, 35, 40, 50, 60, 70, and 80 of FIGS. 1, 2A, 2B, 3A, 3B, and 9 to 13. A side of the magnetic device MD is connected to any one of the plurality of bit lines BL0 to BLm, and the other side of the magnetic device MD is connected to a drain of the cell transistor CT that functions as a switching device. A source of the cell transistor CT is connected to each source line SL. Depending on the applications, other switching devices such as a diode may be used.

Figure 15:
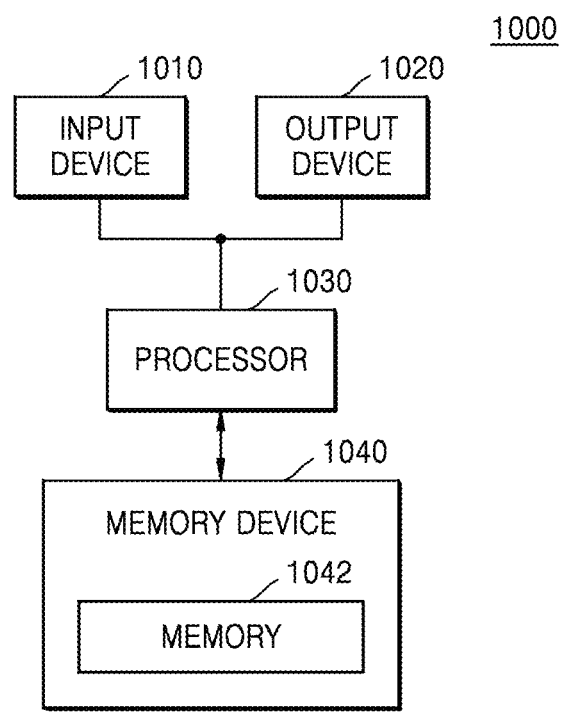
FIG. 15 is a block diagram of an electronic system including a magnetic device, according to some embodiments of the inventive concepts.

FIG. 15 is a block diagram of an electronic system 1000 including a magnetic device, according to some embodiments of the inventive concepts.

Referring to FIG. 15, the electronic system 1000 includes an input device 1010, an output device 1020, a processor 1030, and a memory device 1040. In some embodiments, the memory device 1040 may include a cell array including a non-volatile memory cell, and a peripheral circuit for read/write operations. Alternatively, the memory device 1040 may include a non-volatile memory cell and a memory controller.

A memory 1042 in the memory device 1040 may include at least one selected from the magnetic devices 10, 20, 25, 30, 35, 40, 50, 60, 70, and 80 having the SAF structure including the Ru—Rh alloy layer described with reference to FIGS. 1, 2A, 2B, 3A, 3B, and 9 to 13 according to some embodiments of the present inventive concepts. Alternatively, the memory 1042 may include the magnetic memory device 90 that includes at least one selected from the magnetic devices 10, 20, 25, 30, 35, 40, 50, 60, 70, and 80 described with reference to FIG. 14 according to some embodiments of the present inventive concepts.

The processor 1030 may be connected to the input device 1010, the output device 1020, and the memory device 1040 via an interface and control operations in overall.

Figure 16:
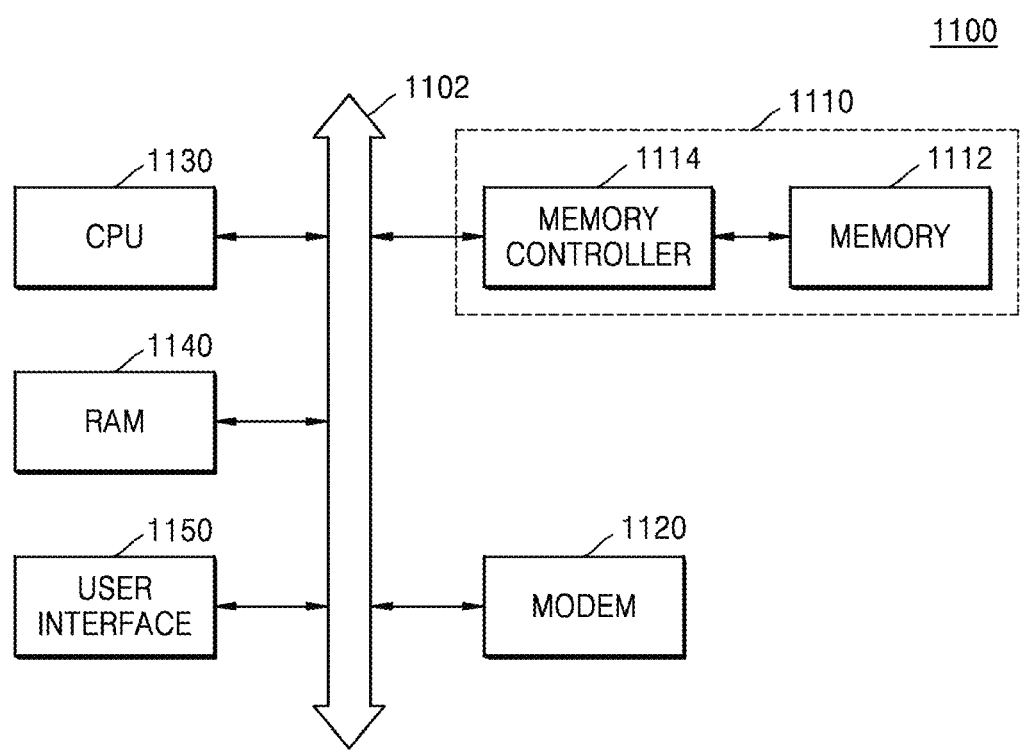
FIG. 16 is a block diagram of a data processing system including a magnetic device, according to some embodiments of the inventive concepts.

FIG. 16 is a block diagram of a data processing system 1100 including a magnetic device, according to some embodiments of the inventive concepts.

Referring to FIG. 16, the data processing system 1100 includes a bus 1102, a non-volatile memory system 1110 electrically connected to the bus 1102, a modem 1120, a central processing unit (CPU) 1130, a random access memory (RAM) 1140, and a user interface 1150.

The non-volatile memory system 1110 may includes a memory 1112 and a memory controller 1114. The non-volatile memory system 1110 stores data processed by the CPU 1130 or externally input data.

The non-volatile memory system 1110 may include a non-volatile memory such as a magnetic RAM (MRAM), a phase change RAM (PRAM), a resistive (RRAM), and a ferroelectric RAM (FRAM). At least one selected from the memory 1112 and the RAM 1140 may include at least one selected from the magnetic devices 10, 20, 25, 30, 35, 40, 50, 60, 70, and 80 having the SAF structure including the Ru—Rh alloy layer described with reference to FIGS. 1, 2A, 2B, 3A, 3B, and 9 to 13 according to some embodiments of the present inventive concepts. Alternatively, the memory 1112 may include the magnetic memory device 90 that includes at least one selected from the magnetic devices 10, 20, 25, 30, 35, 40, 50, 60, 70, and 80 described with reference to FIG. 14 according to some embodiments of the present inventive concepts.

The data processing system 1100 may be used in a portable computer, a web tablet, a wireless phone, a mobile phone, a digital music player, a memory card, an MP3 player, a navigation device, a portable multimedia player (PMP), a solid state disk (SSD), or household appliances.

Figure 17:
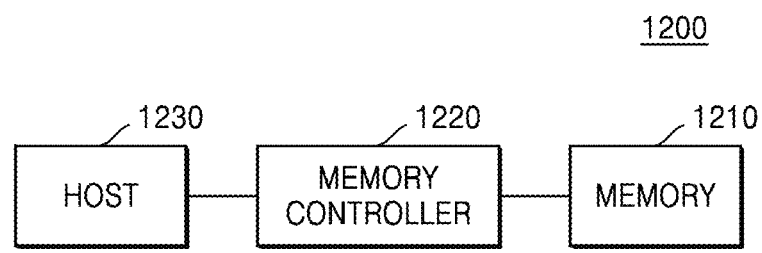
FIG. 17 is a memory card including a magnetic device, according to some embodiments of the inventive concepts.

FIG. 17 is a memory card 1200 including a magnetic device, according to some embodiments of the inventive concepts.

The memory card 1200 includes a memory 1210 and a memory controller 1220.

The memory 1210 may store data. In some embodiments, the memory 1210 as a non-volatile property and thus may secure stored data even when power supply is shut off. The memory 1210 may include at least one selected from the magnetic devices 10, 20, 25, 30, 35, 40, 50, 60, 70, and 80 having the SAF structure including the Ru—Rh alloy layer described with reference to FIGS. 1, 2A, 2B, 3A, 3B, and 9 to 13 according to some embodiments of the present inventive concepts. Alternatively, the memory 1210 may include the magnetic memory device 90 that includes at least one selected from the magnetic devices 10, 20, 25, 30, 35, 40, 50, 60, 70, and 80 described with reference to FIG. 14 according to some embodiments of the present inventive concepts.

The memory controller 1220 may respond to a read/write request from a host 1230 and thus read data stored in the memory 1210 or store data in the memory 1210.

Figure 18:
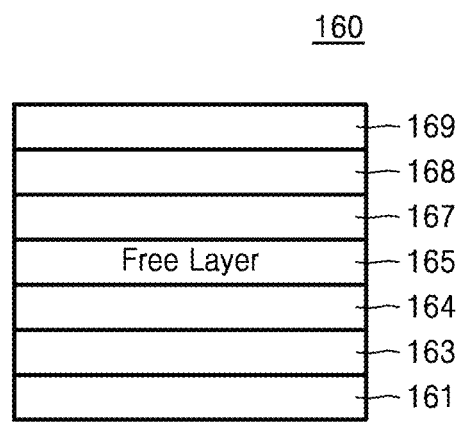
FIG. 18 is a schematic view of a portion of a magnetic device, according to some embodiments of the inventive concepts.

Further, the principles of the present disclosure can be applied to other magnetoresistive structures such as dual MTJ (magnetic tunnel junction) structures, where there are two pinned layers (or reference layers) with a free layer sandwiched therebetween. For example, as shown in FIG. 18, a dual magnetic tunnel junction (DMTJ) magnetic device 160 according to some embodiments may include a first pinned layer 163, a first tunnel barrier layer 164 overlying the first pinned layer 163, a free layer 165 overlying the first tunnel barrier layer 164, a second tunnel barrier layer 167 overlying the free layer 165 and a second pinned layer 168 overlying the second tunnel barrier layer 167. At least one of the first pinned layer 163, the first tunnel barrier layer 164, the free layer 165, the second tunnel barrier layer 167 or the second pinned layer 168 may have a synthetic antiferromagnetic (SAF) structure which is similar to or same as the embodiments discussed above. For example, the SAF structure may be formed of a first ferromagnetic layer, a second ferromagnetic layer, and a ruthenium-rhodium (Ru—Rh) alloy layer provided between the first and second ferromagnetic layers. The DMTJ device 160 may also include a bottom electrode 161 and a top electrode 169.

The principles of the present disclosure can be applied to either in-plane and perpendicular MTJ devices or to combinations of in-plane and perpendicular MTJ devices (e.g., devices in which the free layer has a high perpendicular anisotropy while the equilibrium magnetic moment of the free layer remains in-plane). One example of such a device may be seen in U.S. Pat. No. 6,992,359, the contents of which are incorporated herein by reference in their entirety.

In some embodiments, the inventive concepts of the present disclosure may be applied to the formation of system-on-chip (SOC) devices requiring a cache. In such cases, the SOC devices may include a magnetoresistive element formed according to the present disclosure and coupled to a microprocessor.

While the inventive concepts have been particularly shown and described with reference to exemplary embodiments thereof, it will be understood that various changes in form and details may be made therein without departing from the spirit and scope of the following claims.

What is claimed is:

1. A magnetic device comprising:
a free layer comprising a first magnetization layer;
a pinned layer comprising a second magnetization layer; and
a tunnel barrier layer provided between the free layer and the pinned layer,
wherein at least one selected from the first magnetization layer and the second magnetization layer comprises a synthetic antiferromagnetic (SAF) structure formed of a first ferromagnetic layer, a second ferromagnetic layer, and a ruthenium-rhodium (Ru—Rh) alloy layer provided between the first and second ferromagnetic layers.

2. The magnetic device of claim 1, wherein the Ru—Rh alloy layer comprises at least about 1 at % to not more than about 60 at % of Rh, and a remainder of the Ru—Rh alloy layer comprises a Ru alloy.

3. The magnetic device of claim 1, wherein the Ru—Rh alloy layer has a hexagonal close packed (HCP) crystalline structure.

4. The magnetic device of claim 1, wherein the Ru—Rh alloy layer comprises at least about 1 at % to not more than about 15 at % of at least one element selected from iridium (Ir), rhenium (Re), osmium (Os), molybdenum (Mo), tungsten (W), tantalum (Ta), chrome (Cr), and copper (Cu).

5. The magnetic device of claim 1, wherein a thickness of the Ru—Rh alloy layer ranges from about 3 Å to about 15 Å.

6. The magnetic device of claim 1, wherein at least one selected from the first and second ferromagnetic layers has a multi-layer thin film structure formed by alternately stacking a first layer comprising cobalt (Co) and a second layer comprising platinum (Pt) or palladium (Pd).

7. The magnetic device of claim 1, wherein at least one selected from the first and second ferromagnetic layers is formed of a magnetic material having an $L1_1$ or $L1_0$ type ordered structure.

8. The magnetic device of claim 1, wherein the first and second ferromagnetic layers comprises a crystalline layer.

9. The magnetic device of claim 8, further comprising an amorphous layer between the first ferromagnetic layer and the tunnel barrier layer.

10. The magnetic device of claim 1, wherein the first and second ferromagnetic layers are formed as vertical magnetization layers.

11. The magnetic device of claim 1, wherein the first and second ferromagnetic layers are formed as horizontal magnetization layers.

12. The magnetic device of claim 1, further comprising an antiferromagnetic (AFM) layer that is separated from the tunnel barrier layer by the second ferromagnetic layer.

13. The magnetic device of claim 1, wherein the SAF structure further comprises a Ru layer that is disposed between the first ferromagnetic layer and the second ferromagnetic layer and contacts the Ru—Rh alloy layer.

14. The magnetic device of claim 13, wherein the Ru—Rh alloy layer and the Ru layer comprises a multi-layer thin film structure formed by alternately stacking the Ru—Rh alloy layer and the Ru layer.

15. A magnetic memory device comprising:
a magnetic device comprising a free layer comprising a first magnetization layer; a pinned layer comprising a second magnetization layer; and a tunnel barrier layer provided between the free layer and the pinned layer, wherein at least one selected from the first magnetization layer and the second magnetization layer comprises a synthetic antiferromagnetic (SAF) structure formed of a first ferromagnetic layer, a second ferromagnetic layer, and a ruthenium-rhodium (Ru—Rh) alloy layer and a Ru layer provided between the first and second ferromagnetic layers;
a switching device connected to any one of the free layer and the pinned layer; and
a bit line connected to the other one of the free layer and the pinned layer.

* * * * *